United States Patent
Andrieu et al.

(10) Patent No.: US 7,820,523 B2
(45) Date of Patent: Oct. 26, 2010

(54) FABRICATION OF ACTIVE AREAS OF DIFFERENT NATURES DIRECTLY ONTO AN INSULATOR: APPLICATION TO THE SINGLE OR DOUBLE GATE MOS TRANSISTOR

(75) Inventors: François Andrieu, Grenoble (FR); Thomas Ernst, Florette (FR); Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 706 days.

(21) Appl. No.: 11/579,037

(22) PCT Filed: Jun. 25, 2004

(86) PCT No.: PCT/EP2004/051255
§ 371 (c)(1),
(2), (4) Date: Oct. 30, 2006

(87) PCT Pub. No.: WO2005/109509
PCT Pub. Date: Nov. 17, 2005

(65) Prior Publication Data
US 2007/0246702 A1    Oct. 25, 2007

(30) Foreign Application Priority Data
May 7, 2004    (FR) .................................. 04 50889

(51) Int. Cl.
*H01L 21/30* (2006.01)
(52) U.S. Cl. ........................ 438/455; 438/406; 438/168; 257/E21.567; 257/E21.335; 257/190; 257/347; 257/192; 117/94; 117/915; 117/939
(58) Field of Classification Search ......... 257/190–192, 257/347, E21.567, E21.335; 117/9, 43, 54, 117/58, 934; 438/455, 406, 168
See application file for complete search history.

(56) References Cited

U.S. PATENT DOCUMENTS
5,374,564 A    12/1994 Bruel
(Continued)

FOREIGN PATENT DOCUMENTS
EP    0331 811 A2    9/1989
(Continued)

OTHER PUBLICATIONS

D. Marris, et al., *Design of a SiGe-Si Quantum-Well Optical Modulator*, IEEE Journal of Selected Topics in Quantum Electronics, vol. 9, n°3, p. 747-754, May/Jun. 2003.
(Continued)

*Primary Examiner*—Davienne Monbleau
*Assistant Examiner*—Shweta Mulcare
(74) *Attorney, Agent, or Firm*—McKenna Long & Aldridge LLP

(57) ABSTRACT

The invention concerns a micro-electronic device comprising a substrate, a first insulating zone and a second insulating zone laying on said substrate, a first active zone comprising at least one layer made of a first semi-conductor crystalline material, resting on said first insulating zone which insulates it from the substrate, at least one second active zone comprising at least one layer in a second semi-conductor crystalline material, laying on said second insulating zone which insulates it from the substrate, said first semi-conductor crystalline material having a different composition from that of the second semi-conductor crystalline material and/or different crystalline orientation from that of the second semi-conductor crystalline material and/or mechanical strains from that of the second semi-conductor crystalline material.

23 Claims, 13 Drawing Sheets

U.S. PATENT DOCUMENTS

| | | | |
|---|---|---|---|
| 5,882,987 | A | 3/1999 | Srikrishnan |
| 6,521,041 | B2 | 2/2003 | Wu et al. |
| 6,524,935 | B1 | 2/2003 | Canaperi et al. |
| 6,593,641 | B1 | 7/2003 | Fitzergald |
| 6,600,170 | B1 | 7/2003 | Xiang |
| 6,602,613 | B1 | 8/2003 | Fitzgerald |
| 6,727,179 | B2 | 4/2004 | Deleonibus |
| 2002/0140031 | A1 | 10/2002 | Rim |
| 2002/0171077 | A1 | 11/2002 | Chu et al. |
| 2003/0013323 | A1 | 1/2003 | Hammond et al. |
| 2004/0157402 | A1* | 8/2004 | Doyle et al. ............... 438/406 |
| 2006/0113605 | A1* | 6/2006 | Currie ....................... 257/368 |

FOREIGN PATENT DOCUMENTS

| | | |
|---|---|---|
| EP | 0 513 684 A2 | 11/1992 |
| FR | 2 810 447 A1 | 12/2001 |

OTHER PUBLICATIONS

Coffa et al., *Feasibility Analysis of Laser Action in Erbium-Doped Silicon Waveguides*, IEEE Journal of Quantum Electronics, vol. 36, n°10, p. 1206-1213, Oct. 2000.

Gianni Taraschi et al.; *Ultrathin Strained Si-on-Insulator and SiGe-on-Insulator Created Using Low Temperature Wafer Bonding and Metastable Stop Layers*, Journal of Electrochemical Society, 151(1), G47-G56 (2004).

M. Yang et al.; *High Performance CMOS Fabricated on Hybrid Substrate with Different Crystal Orientations*, Electron Devices Meeting, 2003. IEEE International Publication Date Dec. 8-10, 2003.

Gianni Taraschi et al., *Relaxed SiGe-on-insulator fabricated via wafer bonding and etch back*, J. Vac Sci. Technol. B 20(2), Mar./Apr. pp. 725-726 (2002).

* cited by examiner

FABRICATION OF ACTIVE AREAS OF DIFFERENT NATURES DIRECTLY ONTO AN INSULATOR: APPLICATION TO THE SINGLE OR DOUBLE GATE MOS TRANSISTOR

This application claims priority to International Application No. PCT/EP2004/051255 filed on Jun. 25, 2004 and European Application No. 04 50889 filed on May 7, 2004, both of which are incorporated by reference, as if fully set forth herein.

TECHNICAL FIELD AND PRIOR ART

The invention concerns an improved micro-electronic device in which semi-conductor blocks of different natures, likely to serve for example as active transistor zones, are formed on an insulating layer covering a semi-conductor substrate. The invention also concerns a process for making such a device and can be applied in particular to the formation of transistors improved in terms of consumption and rapidity.

The invention can also help integration onto a same semi-conductor support or a same chip or a same semi-conductor wafer, of components with different and/or hybrid technologies.

In the aim of improving the performances of the transistors, especially in terms of rapidity, it is known that for the latter, "strained" channels are formed for which the mobility of the electrons or the holes is improved. A strained channel is generally formed by at least a first semi-conductor layer based on a first semi-conductor material, to which a mechanical strain is applied in tension or compression by means of another underlying layer at or on said first semi-conductor layer and for example based on a different semi-conductor material from the first semi-conductor material.

An appropriate material to improve the mobility of the holes is often unhelpful as far as the mobility of the electrons is concerned. Therefore, a tensile or compressive strain applied to a given semi-conductor material allows the mobility of one type of carrier rather than another to be significantly increased in this material. For example, SiGe or Ge (001) with a biaxial compression strain applied in the plane (001) provides a significant gain in mobility of the holes in the direction <110>, for example between 100% and 1000% in comparison to solid silicon (001), whereas it permits a smaller gain in the mobility of the electrons, for example less than 100% in comparison to solid silicon.

For example, for CMOS technology circuits, which have simultaneously one or more transistors providing a main conduction by holes and one or more transistors providing a main conduction by electrons, it is difficult to be able to increase, by means of strain channels, both the mobility of the electrons for the N type transistors and that of the holes for the P type transistors. In this type of circuit, it is moreover generally preferable for the performances of the N type transistors and those of the P type transistors to be balanced, which creates an additional difficulty.

The document U.S. Pat. No. 6,600,170 proposes a device which permits these problems to be resolved. This document details in particular an architecture comprising: a semi-conductor substrate 10 covered by a first semi-conductor layer 11 for example relaxed SiGe based. Said first semi-conductor layer 11 is itself covered by a first semi-conductor block which is made of a first semi-conductor based material 12, for example biaxial compressed SiGe, and a second semi-conductor block which is made of a second semi-conductor based material 13, for example biaxial tensile strained Si (FIG. 1).

Such an architecture can be used for example to make CMOS technology circuits with PMOS type transistors, for example, formed by said first semi-conductor block and NMOS type transistors for example, formed by said second semi-conductor block.

Such an architecture can permit CMOS type circuits to be made in which the performances of the NMOS type transistors are improved and balanced with respect to those of the PMOS type transistors.

One disadvantage of the architecture illustrated in relation with FIG. 1 and described in the previously mentioned document is that this architecture is formed by a bulk semi-conductor substrate 10, for example silicon based, without any insulation being provided between said substrate 10 and said semi-conductor blocks used to form the NMOS and PMOS transistors. In terms of consumption in particular, the performances of the transistors formed from such a structure are not optimal. Short channel and latch up effects can occur in particular in these transistors.

Consequently, the problem is raised of finding a structure, in particular on an insulator, comprising both semi-conductor zones specifically optimized for electron conduction and other semi-conductor zones specifically optimized for hole conduction, whilst conserving reduced consumption.

PRESENTATION OF THE INVENTION

This invention concerns a micro-electronic device comprising:
- a semi-conductor support,
- at least one first insulating zone and a second insulating zone laying on said support,
- at least one first semi-conductor zone comprising at least one layer made of a first semi-conductor crystalline material, laying or resting on said first insulating zone which insulates it from the support,
- at least one second semi-conductor zone comprising at least one layer made of a second semi-conductor crystalline material, laying or resting on said second insulating zone which insulates it from the support, said first semi-conductor crystalline material being different by its intrinsic or extrinsic composition, and/or having a different orientation and/or with a different mechanical strain from that of said second semi-conductor crystalline material.

Each of said semi-conductor zones is likely to form an active zone or area in which one or more electronic components, such as transistors, or one or more opto-electronic components, such as optical modulators or transmitters, or one or more electro-mechanical components, or one or more radio-frequency components, may be at least partially formed.

The invention uses on a same support several active zones, for example transistors, each electrically insulated from said support by means of insulating zones, and which are especially different from one another by means of the semi-conductor material in contact with these insulating zones on the support. From one active zone to another, the semi-conductor material directly in contact with the support insulating zones may be different in terms of their crystallographic orientation and/or mechanical strain, and/or intrinsic composition.

Consequently, the invention makes it possible to create, on a same semi-conductor support, a number of active zones each being, due to their semi-conductor material composition and/or crystallographic orientation and/or condition of mechanical strain, optimized for a given type of conduction and/or a given application and/or a given technology.

According to one particular embodiment, the invention uses several different active zones, for example for MOS or CMOS transistors, either single or double gate, located on an insulator and each formed by a single semi-conductor layer, that are homogenous in terms of semi-conductor material and different from one another due to the crystallographic orientation of this material and/or the mechanical strain exerted on this semi-conductor material and/or by the molecular composition of this semi-conductor material.

Said first semi-conductor zone may possibly include one or more other semi-conductor layers on top of said layer made of a first semi-conductor material. Similarly, said second semi-conductor layer may possibly comprise one or more other semi-conductor layers on top of said layer made of a second semi-conductor material.

Said first semi-conductor material and/or second semi-conductor material may be tensile or compressive strained. Each of said first semi-conductor zone and second semi-conductor zone may comprise a strained semi-conductor material. Said first semi-conductor zone may, for example, comprise a semi-conductor material that is tensile strained, while said second semi-conductor zone comprises a semi-conductor material that is compressive strained.

Said support may be a semi-conductor support, for example silicon based and/or Germanium based or GaAs based, possibly covered by one or more semi-conductor layers or at least by an insulating layer.

According to one embodiment, said first insulating zone may belong to a same insulating layer or a same stack of insulating layers as the second insulating zone.

According to another embodiment, said first insulating zone and said second insulating zone may be made based on different dielectric materials and/or different stacks of dielectric materials.

This other embodiment may then permit for example, different mechanical strains to be induced on each of said first semi-conductor zone and said second semi-conductor zone, respectively by means of said first insulating zone and said second insulating zone. In this case, the dielectric material(s) of an insulating zone may be chosen according to the nature of the semi-conductor zone with which this insulating zone is in contact.

In this way, the composition of an insulating zone may be used specifically to permit a specific strain to be induced on the semi-conductor zone with which this insulating zone is in contact.

In this way, the composition of an insulating zone may be used specifically to exert a specific strain on the semi-conductor zone with which this insulating zone is in contact.

Said first and second semi-conductor zones may be separated from one another by one or more dielectric zones.

The invention also provides for a micro-electronic device comprising one or more transistors at least partially formed in said first semi-conductor zone, one or more other transistors at least partially formed in said second semi-conductor zone.

Another aim of the invention is to propose a process for manufacturing such a micro-electronic device. It also concerns a process for making improved single or double gate transistors which can be formed from the device previously described.

More generally, the invention concerns a manufacturing process for such a micro-electronic device comprising the following steps:

a) forming, on a first substrate, at least one first semi-conductor zone in a first semi-conductor crystalline material or that is at least a partially crystalline material, and forming at least a second semi-conductor zone in a second semi-conductor crystalline material or that is at least a partially crystalline material, b) covering said first and second zones with an insulating layer, c) assembling a second substrate on said insulating thickness, d) eliminating the first substrate.

Said first semi-conductor zone and said second semi-conductor zone can be formed by epitaxial growth.

According to one variant of the process, said second semi-conductor zone can be formed by epitaxial growth on one part of said first semi-conductor zone. This part of said first semi-conductor zone on which the second semi-conductor zone is formed may be eliminated after step d).

According to another variant, the first and second semi-conductor zones can be formed by growth on a same material layer.

The first semi-conductor zone and/or the second semi-conductor zone may be formed by several semi-conductor layers, for example by successive epitaxial steps.

The process of the invention can comprise among others the formation of a lateral insulating zone between the two semi-conductor zones. This lateral insulating zone may be obtained by etching of a part of the first substrate and/or at least part of the first semi-conductor zone, and by filling the etched part with an insulating material. According to one embodiment of the lateral insulating zone, the insulating material used to fill the etched part can be the material used in step b) to form said insulating thickness b).

Said first substrate used in this process may be formed by a semi-conductor block, and by at least an etch stop layer covering said semi-conductor block. According to one variant, the first substrate may be formed by a single semi-conductor material block.

BRIEF DESCRIPTION OF THE DRAWINGS

The present invention will be better understood after reading the description of example embodiments given for purely informative purposes and that are in no way limitative, with reference to the attached drawings in which.

Figure 1:
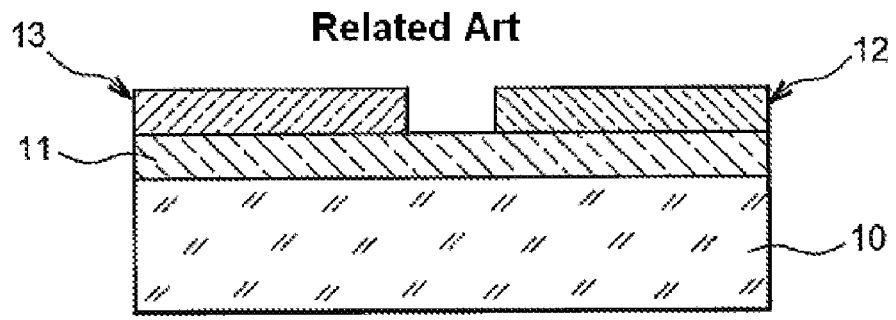
FIG. 1 shows an example of a microelectronic device from the previous art.

Identical, similar or equivalent parts in the different figures have the same numeric references to facilitate the passage from one figure to the next.

The various parts shown in the figures are not necessarily shown at the same scale, to make the figures more legible.

DETAILED PRESENTATION OF EMBODIMENTS OF THE INVENTION

One example of a micro-electronic device according to this invention will now be described in relation to FIG. 2A.

This device comprises firstly a substrate 50 made of a semi-conductor material or possibly several different semi-conductor materials. The substrate 50 can be, according to several examples, Si based and/or Ge based and/or GaAs based, or quartz or SiC based or any other type of semi-conductor based substrate capable of being used as a support for one or more electronic devices.

According to one example, the substrate 50 may be made of a resistive material suited to radio-frequency component applications, for example quartz or sapphire based. In another example, the substrate 50 may be suited to logic component applications, and be formed for example by a layer of silicon covered by a metallic layer, for example TiN based.

The substrate 50 acts as a support in particular for an insulating layer 51 formed by at least one dielectric material, for example $Si_3N_4$, or $SiO_2$, or $Al_2O_3$, or $HfO_2$.

Throughout this description, the term "semi-conductor block" or "semi-conductor zone" will be used.

A first semi-conductor block and a second semi-conductor, referenced respectively A and B, of different compositions, each lays on a zone of the insulating layer 51 covering the substrate 50. The first semi-conductor block A and the second semi-conductor block B can each be formed by a semi-conductor layer or a stack of semi-conductor layers.

The semi-conductor blocks A and B may be formed on a same support or a same wafer, for example by growth on this support or wafer.

The first semi-conductor block or semi-conductor zone A and the second semi-conductor block or semi-conductor zone B can be separated by a dielectric zone referenced C, that can be formed by the same dielectric material as that used for the insulating zone 51 or one or more different dielectric materials.

The first semi-conductor block A and the second semi-conductor block B comprise in particular respectively a layer referenced 54, that is based on a first semi-conductor crystalline material and that has one face totally in contact with the insulating zone $D_1$ of the insulating layer 51, and another layer referenced 55, that is based on a second semi-conductor crystalline material and that has one face totally in contact another zone referenced $D_2$ of the insulating layer 51.

Said first semi-conductor material of the layer 54 and said second semi-conductor material of the other layer 55 have different compositions and/or different crystallographic orientations and/or mechanical strains.

In this way, the semi-conductor blocks A and B can be formed from different semi-conductor materials and/or stacks of different semi-conductor materials or identical semi-conductor materials with different crystallographic orientations and/or mechanical strains.

In the event of the A and B blocks both being formed by a single layer, then two layers are obtained with homogeneous properties and/or different natures.

Each of said semi-conductor blocks A and B is capable of forming an active zone or active area whose composition in semi-conductor material and/or crystallographic orientation and/or mechanical strain may be optimized specifically for a given type of component, application or technology.

In one example, the semi-conductor block A may be optimized, for example, in terms of its semi-conductor material composition and/or crystallographic orientation and/or mechanical strain for a MOS or CMOS application, whilst the semi-conductor block B is optimized for a bipolar application.

In another example, the semi-conductor block A may be optimized, in terms of its semi-conductor material composition and/or crystallographic orientation and/or mechanical strain for a MOS or CMOS application, whilst the semi-conductor block B is optimized for the formation of optoelectronic components.

In a third example, the semi-conductor block A may be optimized, in terms of its semi-conductor material composition and/or crystallographic orientation and/or mechanical strain for a NMOS application, whilst the semi-conductor block B is optimized for a PMOS application Advantageously, for an application with MOS transistors, the semi-conductor blocks A and B may each be formed by a single thin semi-conductor layer (respectively 54 and 55 in FIG. 2A), which will act as an active zone for these transistors, and which may, for example, have a thickness of less than 20 nanometers, for a channel length of less than 50 nanometers for example.

Another example of a device according to this invention will now be described in relation to FIG. 2B.

This device comprises first of all a substrate 50 made of a semi-conductor material or possibly several different semi-conductor materials. The substrate 50 may be, according to several examples, Si based and/or Ge based and/or GaAs based or any type of semi-conductor based substrate capable of serving as a support especially for insulating zones formed by an insulating layer 61 are inserted a first stack of layers of dielectric materials, referenced 62, and a second stack of layers of dielectric materials, referenced 63, different from the first stack.

Figure 2A:
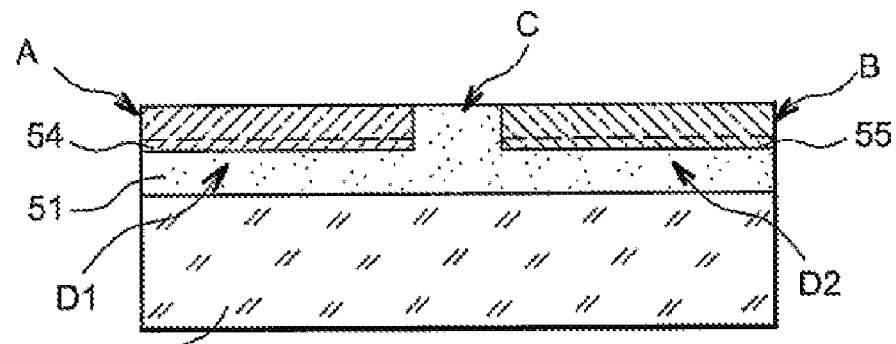
FIG. 2A-2C show microelectronic devices in accordance with an embodiment of the present invention.
Figure 2B:
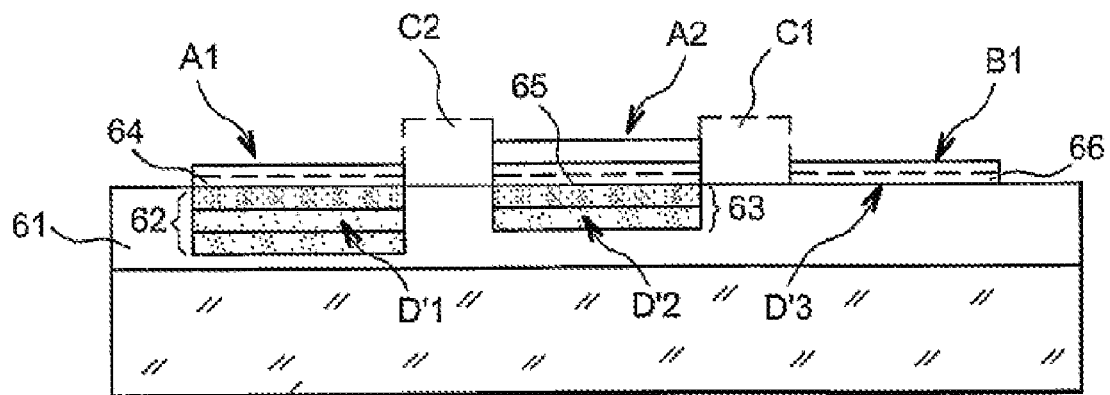

In FIG. 2B, three semi-conductor blocks referenced $A_1$, $B_1$ and $A_2$ lay respectively on the insulating zones referenced D'1, D'2 and D'3, formed respectively by the first stack 62 for the zone D'1, the second stack 62 for the zone D'2, and part of the insulating layer 61 for the zone D'3.

The three semi-conductor blocks $A_1$, $B_1$ and $A_2$ have three different compositions. As a variant, it is possible to have two of these three semi-conductor blocks with different compositions, the third semi-conductor block having the same composition as one of the two others.

Each of the semi-conductor blocks can be formed by a semi-conductor layer or a stack of semi-conductor layers.

Two neighbouring semi-conductor blocks can be separated by a dielectric zone C1, C2. These dielectric zones C1, C2, lay directly on the insulating layer 61 and may possibly be based on the same material as the latter.

Each of the semi-conductor blocks $A_1$, $B_1$, $A_2$ comprise in particular respectively a layer referenced 64, 65, 66, that has one face totally in contact with the corresponding insulating zone D'1, D'2, D'3. Each of these layers 64, 65, 66, is made from a crystalline semi-conductor material, and that also has one face totally in contact with the corresponding insulating zone D'1, D'2, D'3.

At least two of the materials of the layers 64, 65, 66, are different from one another and/or have a different crystallographic orientation. Possibly, it is the three materials of these three layers that are different from one another and/or that have a different crystallographic orientation and/or that have a different strain applied.

In this way, the semi-conductor blocks $A_1$, $B_1$, $A_2$, can be formed by different semi-conductor based materials or identical semi-conductor materials with different crystallographic orientations and/or different mechanical strains.

Each of said semi-conductor blocks $A_1$, $A_2$, $B_1$ is capable of forming an active zone whose composition in semi-conductor material and/or crystallographic orientation and/or mechanical strain may be optimized specifically for a given type of component, application or technology.

For example, the semi-conductor block $A_1$ may be optimized in terms of its semi-conductor material composition and/or crystallographic orientation and/or mechanical strain for a NMOS application, whilst the semi-conductor block A2 is optimized for a PMOS application and the semi-conductor block B1 is optimized for a bipolar application.

In another example, the semi-conductor blocks $A_1$ and A2 may have optimized compositions for the formation of logic circuits, for example for MOS or CMOS technology, whilst the semi-conductor block B is optimized for the formation of RF components or optoelectronic components.

The structural examples presented in FIGS. 2A and 2B are not restrictive. In this way, for example, a microelectronic device of the same type as those previously described, comprising different k semi-conductor blocks or k active zones on an insulator (with k being an integer) is included in the scope of this invention.

These k semi-conductor blocks may advantageously be formed on a same support or a same wafer, for example by growth on this support or this wafer.

Figure 2C:
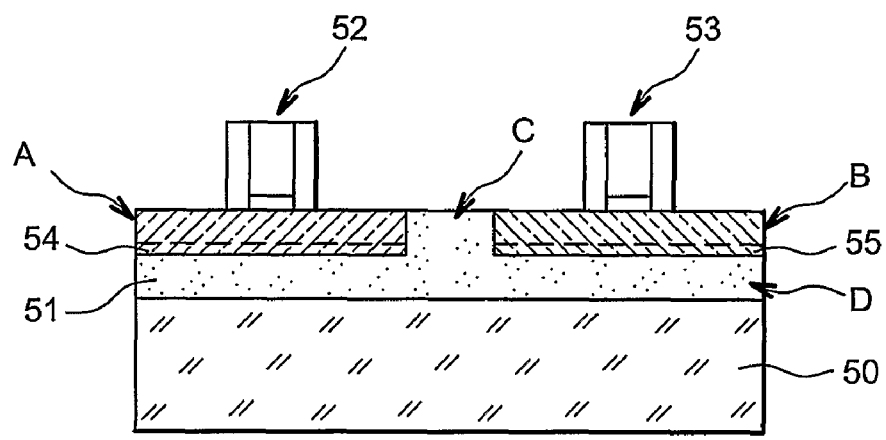

One particular example of an application of the device previously described in relation to FIG. 2A, will now be provided in relation to FIG. 2C: it concerns the creation of two transistors with different properties.

In the first semi-conductor block, A, an active transistor zone or active area may be formed, for example for a NMOS type transistor, comprising at least one source region, at least one drain region and at least one transistor channel (not shown). A gate referenced 52 is laying on said first active zone and associated to a source region, an advantageously N doped drain region, and a channel of this first active zone (not shown) form a transistor, for example of the NMOS type, in this first active zone.

In this case, the semi-conductor layer(s) of the first semi-conductor block A forming this first active zone can be optimized for the conduction of electrons. In this way, the first semi-conductor block A can comprise for example an Si based layer with a tensile strain and/or (100) crystallographic orientation in which one or more transistor channels are formed.

In the second semi-conductor block, B, a second active transistor zone or active area may be formed, comprising at least one source region, at least one drain region as well as a transistor channel (not shown in FIG. 2c). A gate, referenced 53, lays on the second active zone by means of a gate insulating layer and forms a transistor for example of the PMOS type with a source region, an advantageously P doped drain region as well as a channel (not shown) in this second active zone.

In the case for example where the transistor is of the PMOS type, the semi-conductor layer(s) of the second semi-conductor block B forming this first active zone can be optimized for the conduction by holes. In this way, the second semi-conductor block B can comprise for example a Ge or SiGe based layer with compressive strain, and/or Si based with crystallographic orientation of (110), which favours the mobility of the holes and allows the switch frequency between transistors to be increased.

In this way, the respective compositions of each of said first and second active zones may be optimized for each type of charge carrier. Concerning the performances of such a device, in particular in terms of consumption, this consumption is reduced especially due to the zone 51 which insulates the substrate 50 of the first and second active zones and limits the leakage current or latch up phenomena in particular.

The device shown in FIG. 2B can also be used to form transistors, at least three transistors in this case, with different properties in each of the blocks $A_1$, $A_2$ or $B_1$.

In the first semi-conductor block $A_1$, a first active transistor zone can be formed, for example of the NMOS type, comprising at least one source region, at least one drain region as well as a transistor channel (these elements are not shown in FIG. 2B). A gate (not shown), but similar to the gate 52 in FIG.

2C, may lay, by means of a gate insulating layer, for example $SiO_2$ or $H_2O_2$ or $AlO_2$ based, on this first active zone and be associated to a source region, a drain region and a channel in this first active zone and thus form a transistor, for example of the NMOS type.

In the case for example where said first active zone is of the NMOS type, the semi-conductor layer(s) of the first semi-conductor block $A_1$ forming this first active zone may be optimized for the conduction of electrons. In this way, the first semi-conductor block $A_1$ can comprise for example an Si based layer with a tensile strain and/or (100) crystallographic orientation in which one or more transistor channels are formed.

In the second semi-conductor block, B, a second active transistor zone may be formed, for example of the PMOS type, comprising at least one source region, at least one drain region as well as a transistor channel (not shown in FIG. 2B).

A gate, (not shown in FIG. 2B) lays on the second active zone and forms a transistor for example of the PMOS type with a source region, a drain region as well as a channel (not shown) in this second active zone.

In the case for example where one or more transistors of the PMOS type are formed from the second semi-conductor block $A_2$, the semi-conductor layer(s) of this block may be optimized for the conduction by holes. In this way, the first semi-conductor block $A_2$ can comprise for example, a Ge or SiGe based layer with compressive strain, and/or Si based with crystallographic orientation of (110).

Figure 9:
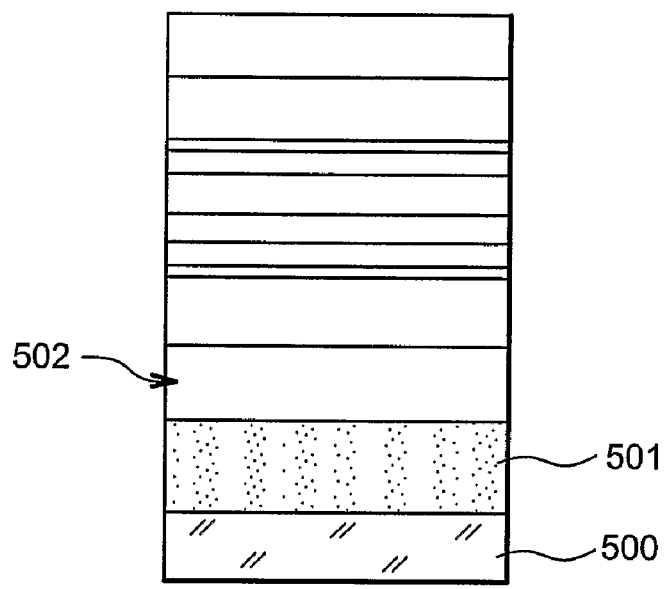
FIG. 9 and 10 show microelectronic devices in accordance with another embodiment of the present invention.
Figure 10:
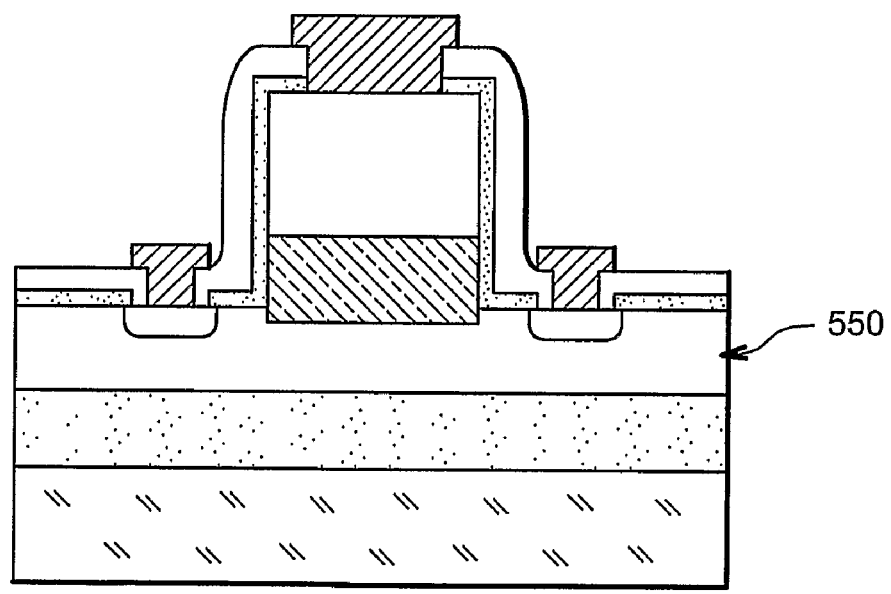

In the third semi-conductor block, $B_1$, a third active transistor zone may be formed with one or more optronic components. In this way, the third semi-conductor block $B_1$ may be formed for example by a modulator, as shown in FIG. 9 and/or a transmitter as shown in FIG. 10.

As for the two previous conductive zones, $A_1$ and $A_2$, the third semi-conductor zone $B_1$ may comprise a layer of semi-conductor materials, for example tensile or compressive strained.

It is therefore possible to create at least three active zones whose respective compositions can be optimized in terms of their composition and/or strain and/or orientation for each type of electronic device, for example an active zone $A_1$, optimized for the formation of NMOS transistors, a second active zone $B_1$ for the formation of PMOS transistors, and a third active zone $A_2$ for the formation of optronic components.

The performances of the transistors of such a device in terms of consumption or switch frequency of the transistors for example, may be improved in comparison to those of the device described above in relation to the FIG. 2C, and especially for the leakage or latch up phenomena. The insulating material respectively of the insulating zones $D_1$, $D_2$, $D_3$, located in interface with the active zones $A_1$, $B_1$, $A_2$, may be chosen specifically for each of these active zones.

In the structure of FIG. 2B, depending on the composition of the dielectric material of each of the insulating zones $D_1$, $D_2$, $D_3$, a specific mechanical strain may be exerted respectively on each of the semi-conductor zones $A_1$, $A_2$, $B_1$. In this way, the insulating zones $D_1$, $D_2$, $D_3$, different dielectric based materials in contact with the semi-conductor zones $A_1$, $A_2$, $B_1$, may permit a different strain to be induced on each of these semi-conductor zones. These strains will permit the properties of each of these semi-conductor zones to be modulated, especially in terms of conduction.

The semi-conductor materials that can be used, mentioned above in relation to FIGS. 2A-2C are compatible with the creation of transistors or logic circuits.

However, it is also possible to use a micro-electronic device according to the invention, as illustrated in FIGS. 2A and 2B, with regard to creating a mixed device, for example one of the semi-conductor zones being used to make one or more transistors or logic components, and the other zone, or one of the other semi-conductor zones being used to make one or more opto-electronic components. In this case, the semi-conductor materials used for the optical part could be for example Si, Ge, SiGe or GaAs.

A general example of the manufacturing process of a device according to the invention will now be described in relation to FIGS. 3A to 3H.

The material at the start of the process is a semi-conductor substrate referenced 101, for example silicon based and/or with a base of one or more other semi-conductor materials. In this way, the substrate can be formed, for example, from a silicon based wafer that may be covered by one or more other layers of semi-conductors.

Figure 3A:
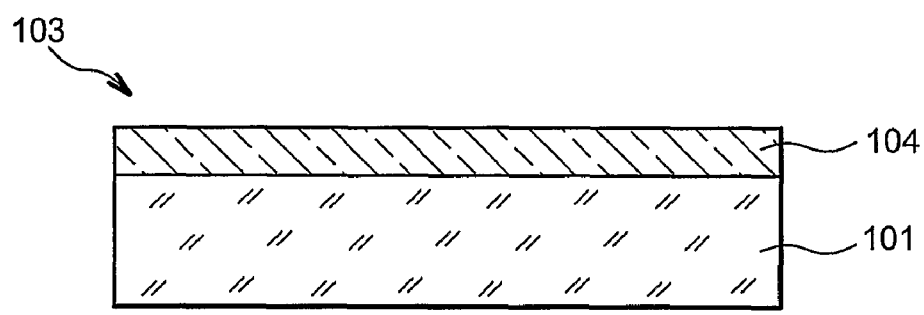
FIG. 3A-3H, 4A-4H, 5, 6A-6H, 7A-7C, 8A-8B show methods for obtaining a microelectronic device in accordance with the present invention.

The growth of a fine layer 103 for example of a thickness of around 15 nm made from a first semi-conductor material 104, for example in silicon, is then created on the substrate 101 using epitaxial growth (FIG. 3A).

Figure 3B:
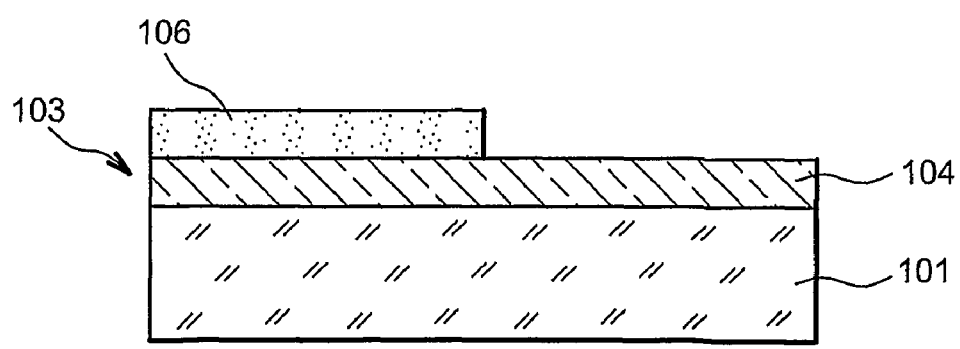
Figure 3C:
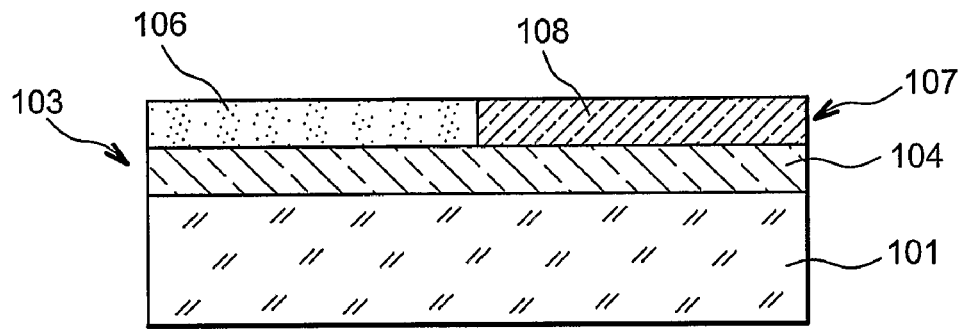

A mask 106, for example made from a dielectric based material layer such as $SiO_2$ or $Si_3N_4$, covered by example by another layer made from a photoresist is then formed on the first semi-conductor material 104. This mask, created for example using photolithography, comprises one or more patterns that cover certain parts of the thin layer 103 of the semi-conductor material 104, whereas other parts of this thin layer 103 are exposed. The position and the shape of the mask 106 patterns depend on said semi-conductor blocks that are to be defined. The photoresist layer of the mask may then be selectively removed, whilst the dielectric material based layer of the mask is conserved and is then used as a hard mask (FIG. 3B).

Then the growth is carried out, epitaxial for example, of a second fine semi-conductor layer 107 on said exposed parts of the first thin layer 103. The second thin layer 107 may have a thickness for example of around 15 nm and may be made from a different semi-conductor material 108 from that 104 of the first thin layer 103, for example SiGe or Ge.

The second fine layer 107 forms a semi-conductor block that is shown with the reference B, and which defines a first active zone.

Figure 3D:
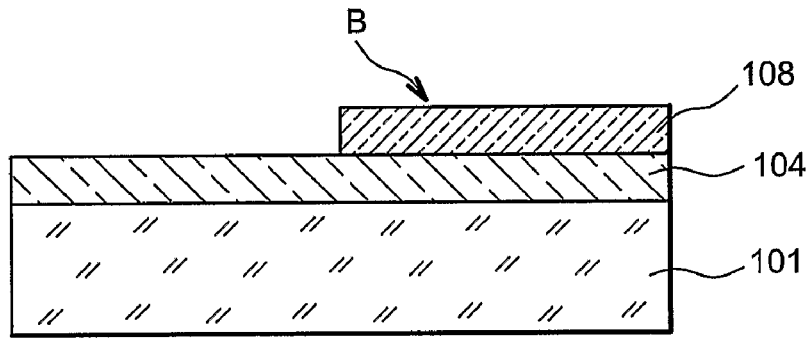

The mask 106 is then removed (FIG. 3D).

An insulating material 111, for example $SiO_2$ or $Si_3N_4$, is then formed by oxidation or deposited on the second thin layer 107 as well as on the exposed parts of the first thin layer 103.

Figure 3E:
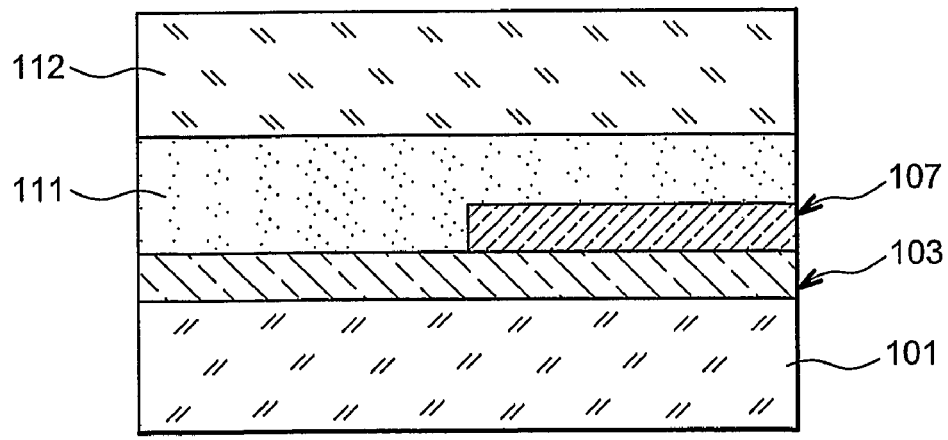
Figure 3F:
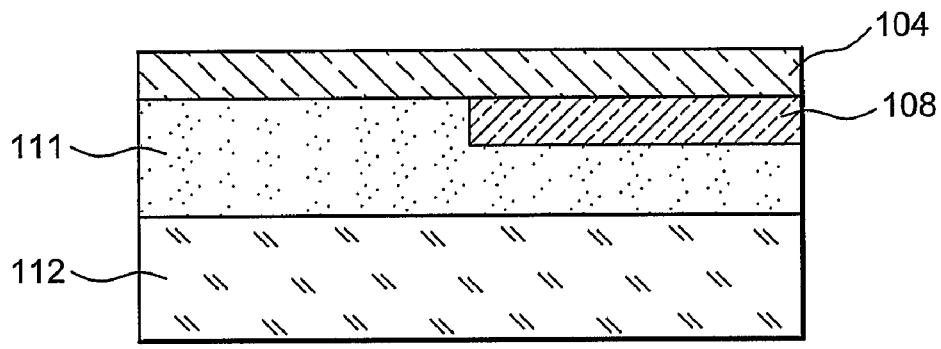
Figure 3G:
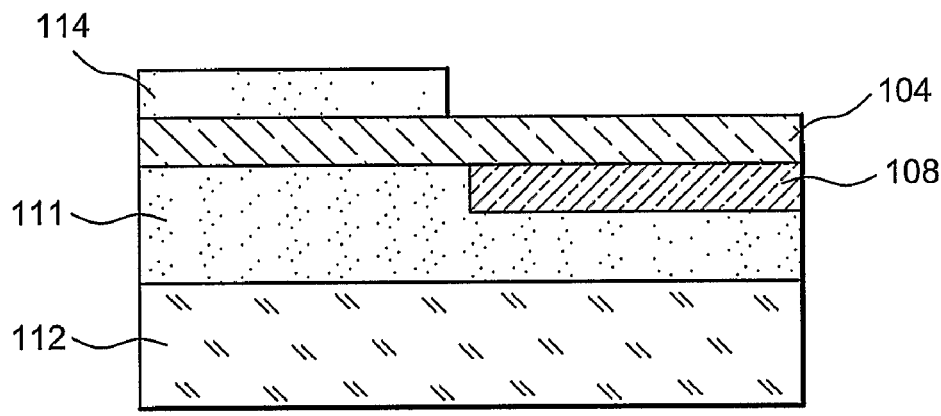

A second substrate 112 placed opposite the first substrate 101 is then bonded to the insulating material 111 (FIG. 3E). The second substrate 112 may be of the same type as the first substrate 101 or of a different type. The latter may be, according to several examples, made from Si, and/or Ge or of the GaAs type or even the SOI (Silicon On Insulator) type.

The bonding step may be carried out using a process such as that described for example in the document US-2002/0140031.

The first substrate 101 is then removed (FIG. 3F), in order to expose the first fine layer 103. It can be removed by etching one or more times, for example using a technique described in the documents U.S. Pat. Nos. 6,521,041 or 5,882,987. According to one variant, a smart cut process, as described in the document U.S. Pat. No. 5,374,564 may be used to remove it. A chemical etching process which uses one or more etch stop layers may also be used. According to another variant, possibly combined with the smart cut process, the substrate 101 may be removed at least partially by chemical-mechanical polishing.

The second substrate 112 is then used as a new support for the thin layers 103 and 107. A mask 114, which may be made for example from a photoresist or an insulating material (FIG. 3G) is then formed on the first semi-conductor material 104, for example using a photolithography process. The form and the position of the patterns of the mask 114 depend respectively on the position and the shape of said semi-conductor blocks that are to be formed.

With the first substrate 101 eliminated, the alignment marks formed on the latter which could have helped to position the mask 114 in particular have disappeared.

Consequently, the mask 114 can be made according to a first variant, without using the alignment marks, or, according to a second variant, after carrying out a step where the alignment marks of the first substrate 101 are regenerated or reproduced on the second substrate 112, for example using a method of the prior art such as that described in the document EP 513 684A.

Etching the first semi-conductor material 104 through the second mask 114 permits in particular the removal of the parts of the thin layer 103 covering the second semi-conductor material 108 and also to expose part of the insulator 111.

For example, in the case of the first semi-conductor material 104 being Si based and the second semi-conductor material 108 being Ge or SiGe based, the first semi-conductor material 104 may be etched selectively with respect to the second material 108, using TMAH (tetra methyl ammonium hydroxyl). It is also possible to use a $HNO_3$ or $H_2O_2$ based preparation for the etching.

A second semi-conductor material block referenced A which defines a second active zone, is thus formed in the first semi-conductor material 104.

Figure 3H:
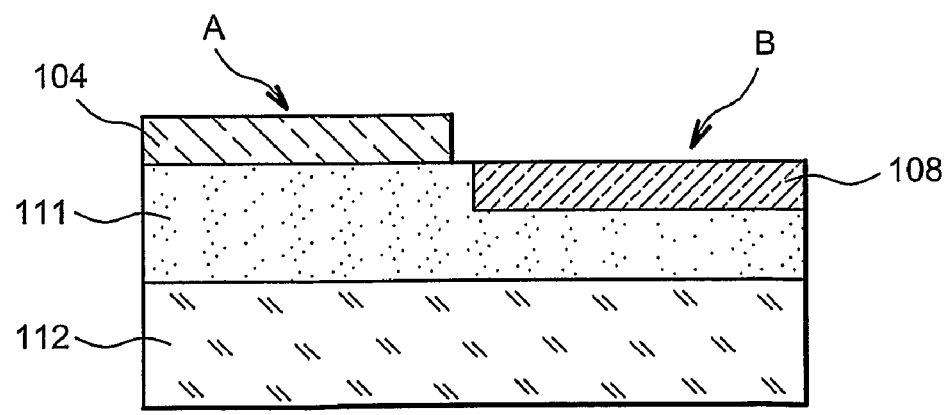

The architecture obtained, illustrated in FIG. 3H, presents semi-conductor blocks referenced A and B made from different semi-conductor materials 104, 108, on a same insulating material 111 covering the second substrate 112. Once the semi-conductor blocks A and B, have been doped, they could be used for example as active zones for transistors.

The invention is not restricted to the example that has just been described. The process of the invention may be applied to the formation of k (where k is an integer greater than 2) semi-conductor blocks each comprising a different semi-conductor material in contact with the insulating zone D. This variant would permit, for example, to form k active zones with different semi-conductor material compositions in contact with a same insulating material.

To achieve this, it is possible to grow k different semi-conductor materials instead of just two (referenced 104 and 108 in the process that we have just described) and to carry out as many masking and etching operations (respectively described in relation to FIGS. 3C and 3D or 3G and 3H) as required to define these k different semi-conductor blocks. This process makes it possible to remain compatible with the requirements of the high integration density of micro-electronics. The location and positioning of the active zones with respect to one another may be controlled before bonding to the second substrate 112.

A second example of the process implemented according to the invention will now be described in relation with FIGS. 4A to 4H.

The initial material comprises a substrate 200 covered by a first layer referenced 202 on which a second layer referenced 204 may rest.

The substrate 200 may be any type of semi-conductor based substrate that can act as a physical support for the layers 202 and 204. The latter may be, according to several examples, silicon and/or Germanium based.

Said first layer 202 covering the substrate 200 may be semi-conductor or dielectric material based and may later serve as an etch stop layer. This first layer 202 may have a thickness of between 1 nanometer and several hundreds of nanometer, for example 300 nanometers.

As concerns the second layer 204, it may be a monocrystalline semi-conductor layer with a thickness for example of a few dozen nanodmeters and may act as the base layer for epitaxial growth. This second layer 204 is present on the first layer 202, particularly in the case of the latter being an amorphous semi-conductor material. The material forming the first layer 202 may be selected such that the substrate 200 is capable of being etched selectively with respect to the first layer 202 and that the first layer 202 is capable of being etched selectively with respect to the second layer 204.

According to one example, the first layer 202 may be $SiO_2$ based, whilst the second layer 204 is SiGe or Ge based and has a thickness of between 10 nanometers and 100 nanometers. According to another example, the layer 202 may be $Si_{0.5}Ge_{0.5}$ based with a thickness greater than the critical relaxation thickness of SiGe on the substrate 200, whilst the layer 204 is strained Si based and has a thickness of between 10 nanometers and 50 nanometers, and/or less than the critical relaxation thickness of the Si on the first layer 202.

The superposition of the substrate 200/first layer 202/second layer 204 may form a Silicon On Insulator type substrate (SOI), or a Strained Silicon On Insulator type substrate (sSOI), or a Silicon Germanium On Insulator type substrate (SGOI).

According to one example, the superposition substrate 200/first layer 202/second layer 204 may be one of the following superpositions: $Si/SiO_2/SiGe$, or $Si/SiO_2$/strained Si, or Si/SiGe/GaAs or SiGe/Si highly doped/Si undoped, or Si/SiGe/Si.

From this initial superposition that we have just described, one or more trenches 205 may be formed first of all in the second layer 204, for example by photolithography then etching of the latter. The trenches 205 define the positions of the semi-conductor blocks that will be formed later on either side of them.

According to several possibilities, the bottom of the trenches 205 may be situated in the second layer 204 (FIG. 4A) or at the level of the first layer 202, for example at the surface of this first layer 202.

The trenches 205 may then be filled by an insulating material 206, for example $SiO_2$ or $Si_3N_4$, in order to form a lateral insulation between said semi-conductor blocks that are to be formed.

The trenches 205 may be filled so that the insulating material 206 spills over the top of the surface of the layer 204. In this case, a masking then an etching step of the insulating material 206 may permit the formation of a dielectric zone to be completed, that will be given the reference C (FIG. 4B).

Local growth is then carried out on the second layer 204 of a first semi-conductor thickness referenced 208, formed by a semi-conductor layer or a stack of semi-conductor layers. Said first thickness 208 may have for example a semi-conductor material base, for example silicon and/or Germanium, and/or Gallium arsenide, and may possibly comprise a strained semi-conductor material, for example tension strained Si. This growth may be achieved by one or more selective epitaxial growths with respect to the insulating material 206. The composition of the first semi-conductor thickness 208 may be selected in particular such that the latter is capable of being etched selectively with respect to the second layer 204 and vice versa.

According to one variant, in the case where the first layer 202 covering the substrate 200 is a dielectric based material, for example a silicon oxide, and the bottom of the trenches is at the level of this first layer 202, the trenches 205 do not need to be filled by the insulating material 206. In this case, immediately after the trenches 205 have been formed, the first thickness 208 may be formed on the second layer referenced 204, for example by one or more selective epitaxial growths with respect to the first layer 202.

The previously described steps for forming the first semi-conductor thickness 208 and the trenches may be carried out in a different order.

Figure 4A:
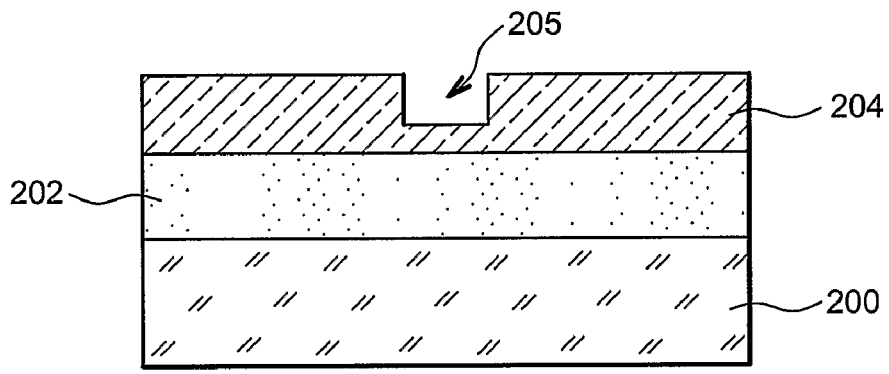
Figure 4B:
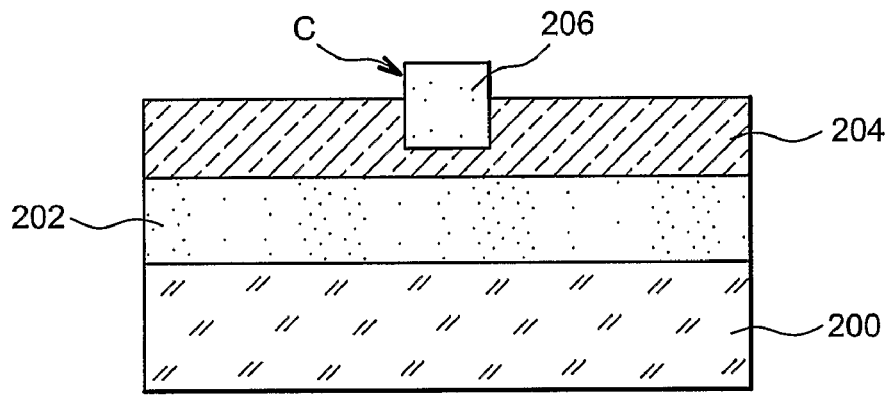
Figure 4C:
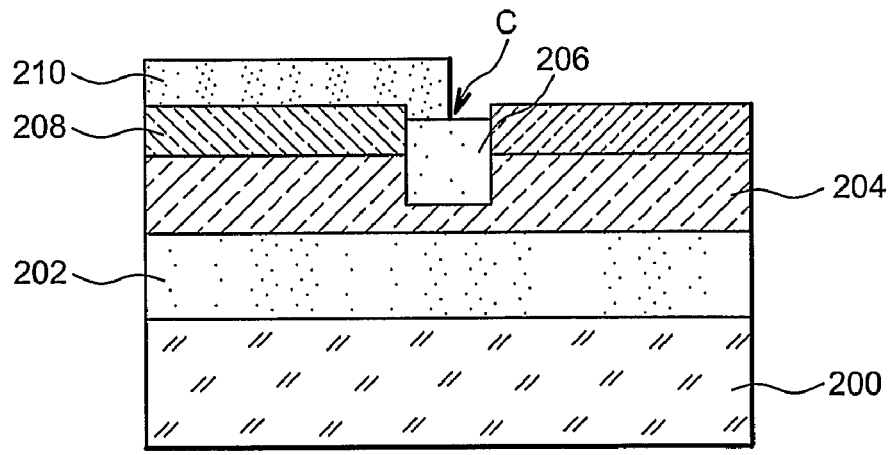

The masking 210 is then carried out on a part of the first semi-conductor thickness 208, for example using a hard dielectric based mask such as $SiO_2$ or $Si_3N_4$ and/or a photo-resist mask (FIG. 4C).

The form and the location of this masking 210 depend respectively on the shape and the location of the semi-conductor blocks that are to be formed.

Then, selective etching of parts not protected by the masking 210 of the semi-conductor thickness 208 is carried out to the level of the second layer 204.

Figure 4D:
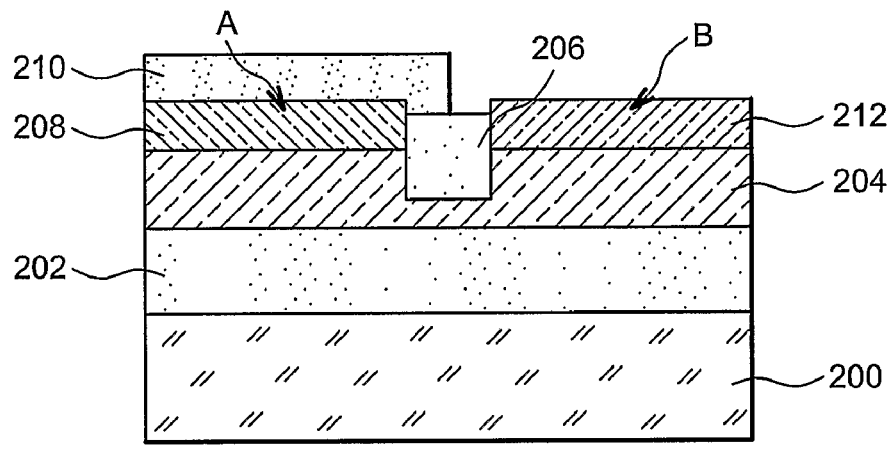

A selective growth step is then carried out, at the position of the etched parts of the first semi-conductor thickness 208, of a second semi-conductor thickness 212 formed by a semi-conductor layer or a stack of semi-conductor layers, and which is different, by its composition and/or its strains from the first semi-conductor layer 208 (FIG. 4D).

The first semi-conductor layer 208 and the second semi-conductor layer 212 may be formed on the basis of different semi-conductor materials or mixtures of different semi-conductor materials or different stacks of semi-conductor materials.

The second semi-conductor thickness 212 may be, for example, silicon and/or germanium and/or gallium arsenide based and may possibly comprise a strained semi-conductor material, for example compressive strained SiGe.

The composition of the second semi-conductor thickness 212 may be chosen in particular so that the layer 204 is capable of being etched selectively with respect to the second semi-conductor thickness 212.

The growth step of the second semi-conductor thickness 212 may be carried out by one or more selective epitaxial growths with respect to the insulating material 206 in the case of the trenches 205 being filled, or one or more selective epitaxial growths with respect to the etch stop layer material, in the case of the trenches not being filled.

The first semi-conductor layer 208 etched as well as the other semi-conductor layer 212 that has just been created, respectively form a first semi-conductor block that is given the reference A and a second semi-conductor block that is referenced B. These semi-conductor blocks A and B thus have different compositions and/or different strains.

The masking 210 is then removed. Then an insulating material 214 is deposited (FIG. 4E), for example $SiO_2$ or $Si_3N_4$ based on it all. The insulating material 214 may be different from the material 206 that may have been previously used to fill the trenches. In the case of the trenches not being filled beforehand, they may be filled with the insulating material 214.

A second substrate 216 (FIG. 4E) is then bonded to the insulating material 214. This bonding step can be carried out by molecular bonding process, as described for example in the document US 2002/0140031. The second substrate 216 may be of the same type as the first substrate 200 or of a different type. This second substrate may be for example Si and/or SiGe and/or GaAs based, or even of the SOI type. The material 214 forms an insulation between the semi-conductor blocks A and B.

The first substrate 200 is then removed, by etching it for example using a technique described in the documents U.S. Pat. Nos. 6,521,041 or 5,882,987. According to one variant, a smart cut process, as described in the document U.S. Pat. No. 5,374,564 may be used to remove it. The etching may be extended to the second layer 202 which is then used as an etch stop layer.

Figure 4E:
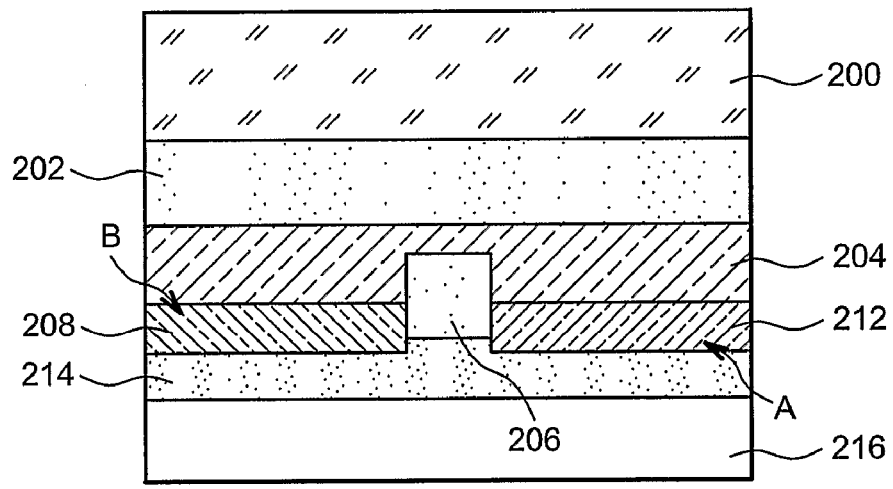
Figure 4F:
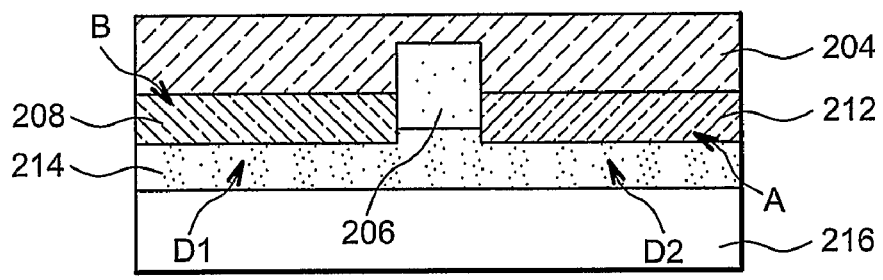

The first layer 202 is then removed by etching again (FIG. 4F).

With the first substrate 200 eliminated, the alignment marks formed on the latter, which could have been used as references for any possible subsequent masking operations, have disappeared. A step to reproduce or regenerate the alignment marks on the second substrate 216 is then carried out, using a known method for example as described in the document EP 513684 A.

Then, the second layer 204 is removed, for example by selective etching with respect to the semi-conductor material 208, the semi-conductor material 210 and the insulating material 214.

According to one variant, the second layer 204 may also be removed by successive repetition of masking and selective etching.

Figure 4G:
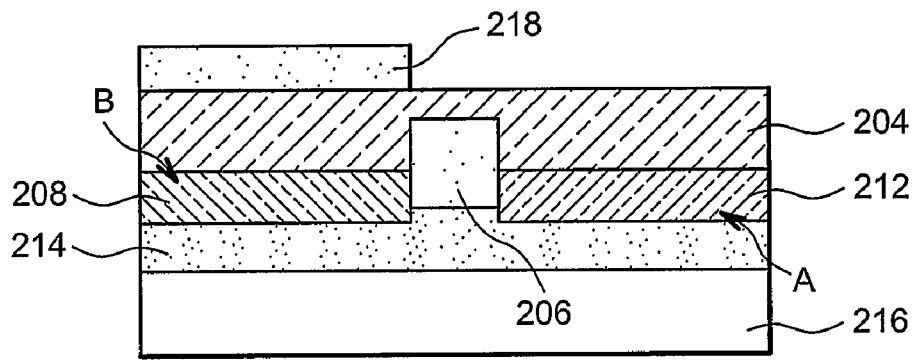

For example, a mask formation step 218 on the parts of the second layer 204 extending from the first semi-conductor layer 208 may be carried out (FIG. 4G). Then, an anisotropic etching step of the parts of the second layer 204 not protected by the mask, may be carried out. The mask 218 is then removed.

The remaining parts of the second layer 204 may then be removed by means of another masking step followed by another etching step.

Figure 4H:
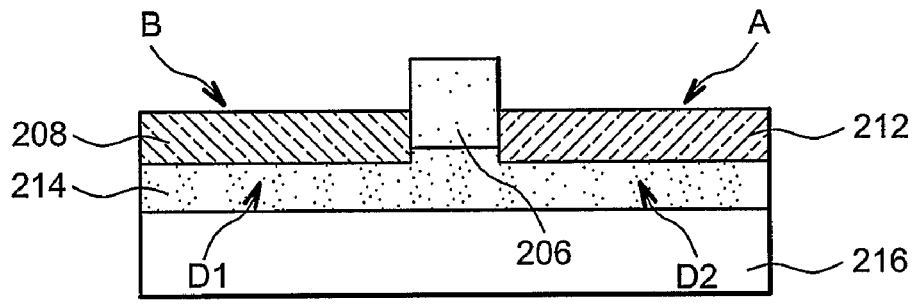

An architecture is thus obtained, illustrated in FIG. 4H, presenting semi-conductor blocks A and B of different natures, for example based on different semi-conductor materials or different stacks of semi-conductor materials. The semi-conductor blocks A and B each rest on a zone respectively referenced $D_1$ and $D_2$ of a same insulating material 111, acting as the insulation with the substrate 112. Another part of the same insulating material 120 possibly covered by another insulating material 206 may act as a lateral insulation zone between the different semi-conductor blocks A and B.

According to one previously described process, an architecture may be formed, as illustrated in FIG. 4H, presenting semi-conductor blocks A and B each of a same semi-conductor material but with different crystallographic orientations from one block to another.

For such a variant of the process, the initial substrate 200 may be made of silicon, for example with a crystallographic orientation (110), covered this time by a dielectric material based layer 202, for example a layer of silicon oxide of a thickness of around 100 nm, and another semi-conductor layer 204, for example silicon with a crystallographic orientation different from that of the substrate 200, for example with an orientation (100).

As for the example of process previously described in relation to FIGS. 4A to 4C, the insulating zone C is made in the layer 204, then the first semi-conductor layer 208 on this same layer 204. The mask 210 is then formed on the thickness 208.

Then, by anisotropic etching, or by several successive anisotropic etching operations, the unmasked part of the thickness 208 is removed. Then following on from this unmasked part, the layer 204 is etched, then the layer 202, stopping on or in the substrate 200.

A stack formed by a semi-conductor layer 220, and possibly by another semi-conductor layer 221 that may later act as an etch stop layer, and a second semi-conductor thickness 212, is then formed on the exposed parts of the substrate, for example by several successive epitaxial growths.

The layers 220, 221, 212 may have identical crystallographic orientations to one another and identical to that of the substrate 200, for example an orientation (110). The latter may each have a thickness for example of around 10 nanometers or several dozen nanometers.

The semi-conductor material(s) composing each of these layers 220, 221, 212, may be selected so that the layer 220 is capable of being etched selectively with respect to the layer 221, and that the layer 221 is capable of being selectively etched with respect to the layer 212.

Figure 5:
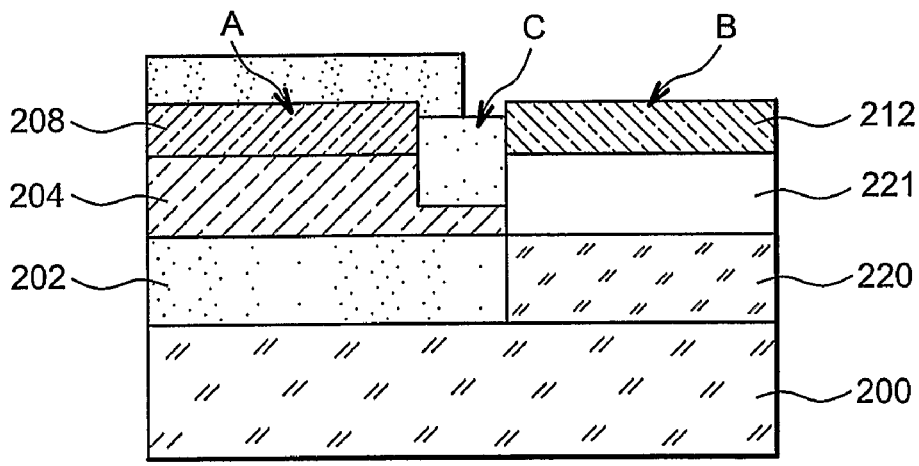

The stack 220/221/212 may be, according to one example, as follows: Si with crystallographic orientation (110)/SiGe with crystallographic orientation (110)/Si with crystallographic orientation (110) (FIG. 5).

According to one advantageous embodiment, the layer 221 and the layer 204 may be formed using the same base semi-conductor material, which possibly, may permit them to be removed simultaneously later on.

Once the second semi-conductor layer 212 has been formed, the mask 210 is removed. The insulating material 214 is deposited, and the second substrate 216 bonded, as previously described in the previous process, in relation with FIG. 4E.

The first substrate 200 is then removed for example by CMP chemical mechanical polishing), then the layer 220, for example by selective etching with respect to the layer 221. Then, the insulating layer 202 is also removed, for example, by selective etching with respect to the layer 221 and the layer 204. Then the layer 204 is removed, for example by selective etching with respect to the layer 208, then the layer 221 is removed, possibly by selective etching with respect to the second semi-conductor thickness 212 and the second semi-conductor thickness 208.

According to several examples, the layer 204 may be removed using a hydrofluoric acid based solution, whilst the layer 220 may be removed using TMAH (tetra methyl ammonium hydroxyl). The layer 221 may be removed using a $HNO_3$ and HF solution, as described for example in the document (1) referenced at the end of this description.

According to one variant, the removal of the layers 202, 220, 204 and 221 may be preceded by masking steps. In this case, at least certain etching steps of the layers 202, 220, 204 and 221 may be non-selective.

As for the example of the process (previously described), in relation to FIG. 4H, at the end of this example of the process, we obtain the semi-conductor thicknesses 208 and 212 respectively forming a semi-conductor block A and a semi-conductor block B resting on the same insulating material 214. The semi-conductor blocks A and B are this time formed by a same semi-conductor material, but which have different crystallographic orientations to one another.

Another example of a process used according to the invention will now be described in relation to FIGS. 6A-6H.

The initial material is a substrate 400, for example silicon based covered by a stack 401 formed by for example four layers respectively referenced 402, 404, 406, 408.

The first layer 402 and the second layer 404 of the stack 401 may be formed on the basis of selected materials, such that the first layer 402 is capable of being etched selectively with respect to the second layer 404.

The first layer 402 may have a thickness of between for example 100 nanometers and several microns, and be composed of an insulating or semi-conductor material. Preferably, the latter will be made from a semi-conductor material, for example relaxed $Si_{0.5}Ge_{0.5}$.

The second layer 404 may be for example around several dozen nanometer in thickness, and made from a semi-conductor material, different from that of the first layer 402, for example silicon. In the case for example where the layer 402 is made from relaxed $Si_{0.5}Ge_{0.5}$ and the second layer 404 made from silicon, the latter may be strained and have a thickness smaller than the critical relaxation thickness of silicon on relaxed $Si_{0.5}Ge_{0.5}$.

The third layer 406 of the stack 401 may be for example around several dozen nanometer in thickness, and made from a semi-conductor material, different from that of the second layer 404, and possibly identical to that of the first layer 402, for example relaxed $Si_{0.5}Ge_{0.5}$.

The fourth layer 408 may be for example compressive strained Ge and may have a thickness of around ten nanometers. In the case for example of the third layer 406 being made of relaxed $Si_{0.5}Ge_{0.5}$ and the fourth layer 408 being made of Ge, the latter will preferably have a thickness less than the critical relaxation thickness of Ge on $Si_{0.5}Ge_{0.5}$.

Figure 6A:
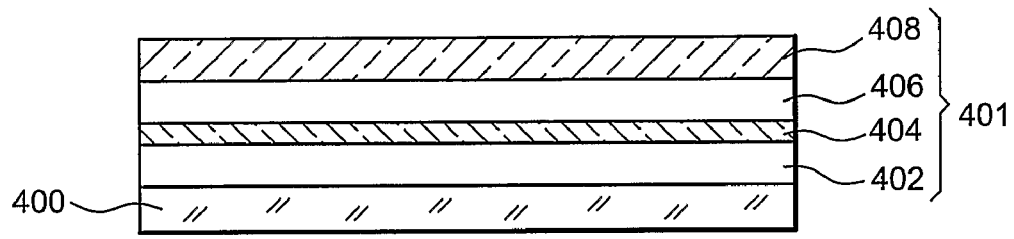

In the case of the stack 401 being solely formed by semi-conductor layers, the latter may be obtained for example by a succession of epitaxial growths (FIG. 6A).

A dielectric layer is then formed, referenced 409, on the stack 401. This dielectric layer 409 may comprise a first sub-layer referenced 410 for example made from $SiO_2$, covered by a second sub-layer 411 for example, made from $Si_3N_4$.

One or more insulation zones are then created, for example of the STI (shallow trench insulation) type, which provide insulation between the active zones that will be formed later.

Figure 6B:
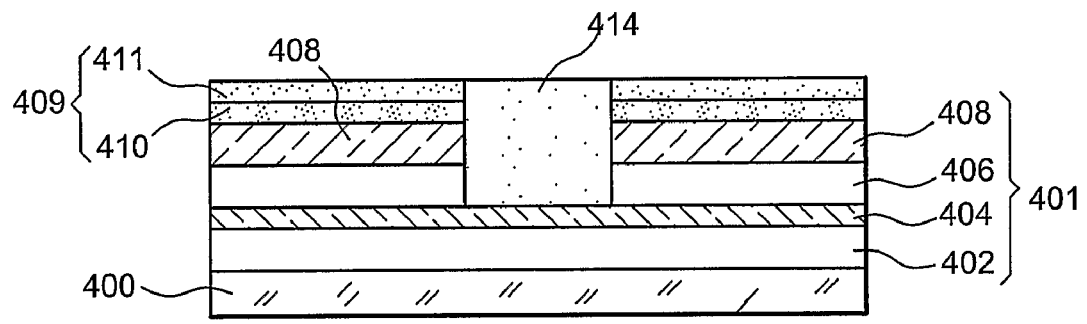

These insulation zones may be formed by trenches defined in the dielectric layer 409 and a portion of the stack 401, for example up to the level of the surface of the second layer of the stack 401, that is filled by an insulating material 414 (FIG. 6B).

Figure 6C:
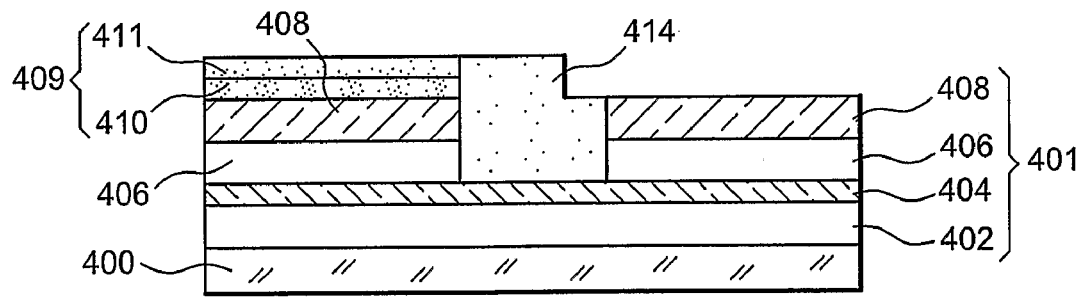

Then part of the dielectric layer 409 is removed (FIG. 6C). This part removed from the layer 409 reveals a part of the stack 401 and corresponds to the future location of a semi-conductor zone. Said removal may be carried out by means of an etching process using a mask for example made from a photoresist, whose patterns, obtained by photolithography, are formed to suit said future location of said semi-conductor zone. One portion of the insulating zones may possibly disappear during this removal, especially in the case of the insulating material 414 being of the same nature as the materials of the dielectric layer 409.

Figure 6D:
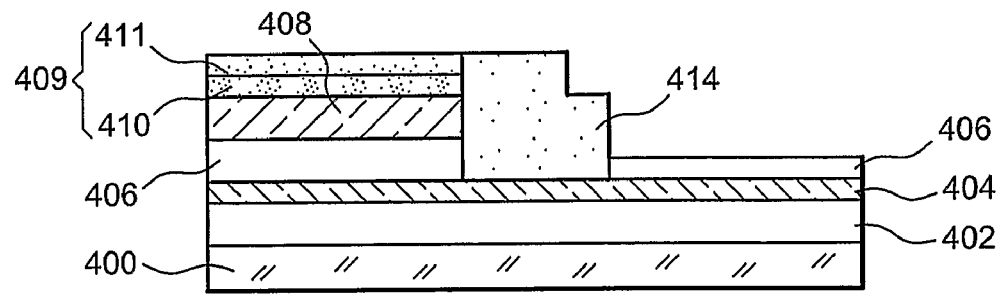

Then selective etching is carried out with respect to the third layer 406 of a part not covered by the dielectric layer 409 of the fourth layer 408. This etching may be non-selective and a portion of the third layer 406 of the stack 401 may be consumed (FIG. 6D).

Figure 6E:
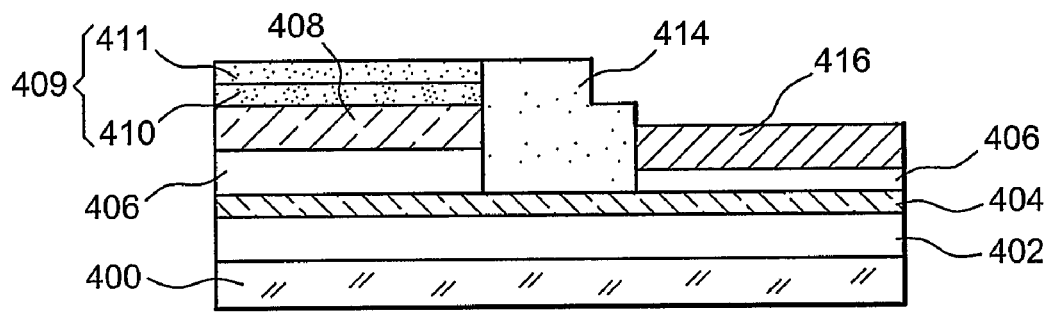

On the surface uncovered by the etching, epitaxial growth is carried out, possibly selectively, of a semi-conductor layer 416 (FIG. 6E). If the epitaxial growth is not selective, a masking level is added and then etching carried out through this mask to remove the unwanted part of the layer 416. Advantageously, the material of the layer 416 is tensile strained silicon, with a thickness less than the critical relaxation thickness of silicon on the material of the layer 406.

Figure 6F:
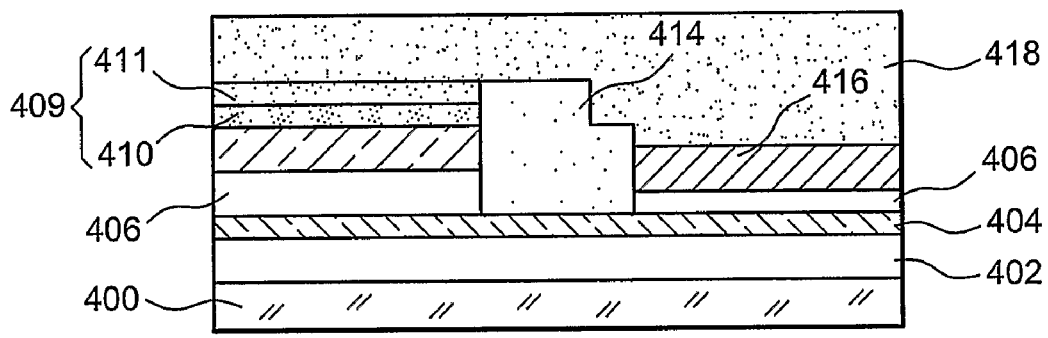

An insulating material 418 is then deposited on the assembly (FIG. 6F).

Figure 6G:
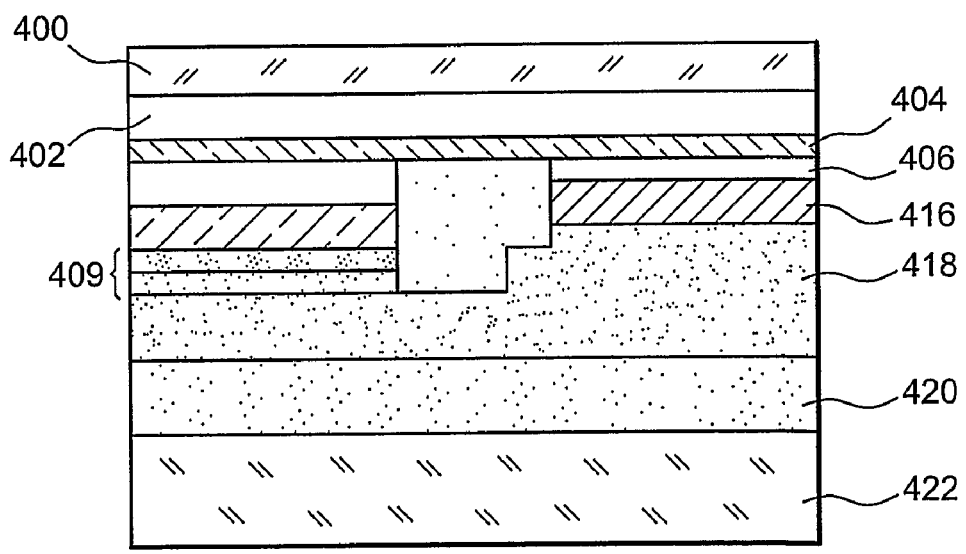

Then possibly after carrying out a polishing step on the insulating material, 418, the second substrate 422, for example made of silicon and that may be covered by a dielectric 420, for example $SiO_2$ based, is bonded (FIG. 6G).

The substrate 400 is then removed for example by chemical-mechanical polishing, then the layer 402, then the layer 404, then the layer 406 selectively with respect to the layers 408 and 416.

For example, in the case of the layer 408 being made from compressive strained Ge, and the layer 416 made from tension strained silicon, the layer 406 may be removed by oxidation, selectively with respect to the layer 416 then deoxidation is carried out. The remaining parts of the layer 406 may be then possibly etched using TMAH (tetra methyl ammonium hydroxyl).

Oxidation followed by deoxidation may be used in all circumstances as a means of adjustment to remove sacrificial layers such as the layer 406.

The removal of the layer 406 may be carried out by selective etching with respect to the layer 416 then by another selective etching step with respect to the layer 408. This removal may also be carried out by successive masking and etching steps.

An architecture is thus obtained comprising two semi-conductor zones referenced $A_1$ and $B_1$, of different natures, in conformity with the invention and respectively laying on a first insulating zone $D'_1$ and a second insulating zone $D'_3$, different from the first.

In this example, the dielectric thickness 409 between the first insulating zone $D'_1$ for example nitride/oxide has been conserved under one of the semi-conductor zones. One advantage of conserving this thickness may be for example to provide a specific strain on the semi-conductor zone $A_1$, for example using nitride.

In this configuration, the dielectric thickness 409 under the semi-conductor zone $A_1$, strains the latter without inducing any strain on the semi-conductor zone $B_1$. The specific interest and advantage of this variant may be the possibility of applying a specific localized strain to each of the semi-conductor zones $A_1$ and/or $B_1$.

From such an architecture, it is possible to carry out steps to form active transistor zones or areas for example, for example using MOS technology, respectively in the semi-conductor blocks or semi-conductor zones $A_1$ and $B_1$.

To complete the formation of active zones or areas from the previously described architecture, illustrated in FIG. 4H, several doping steps, for example by implantation, may be carried out in the semi-conductor blocks A and B. It is thus possible to define source and drain regions, as well as transistor channel in each of the semi-conductor blocks A and B.

After forming said active zones, it is then possible to form single gate transistors and to obtain a device for example as illustrated in FIG. 2B. In order to do so, known definition steps for transistor gates, for example the formation of gate insulators for example by oxidation or by deposition, depositing the gate material, masking then etching the gate material and the gate insulator, forming spacers can be carried out.

Figure 6H:
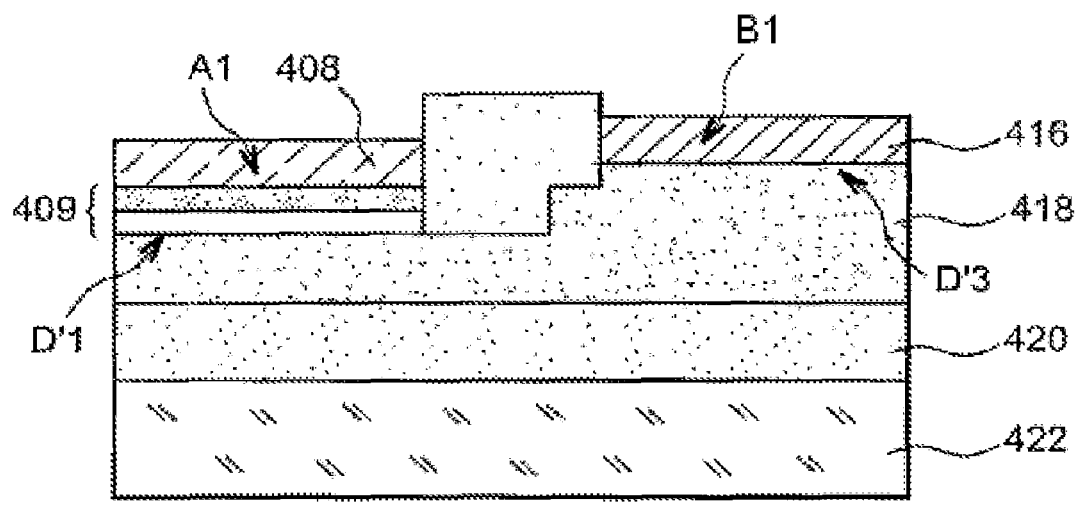

The applications of such architecture are not restricted to the formation of circuits in MOS or CMOS technology. Architecture as illustrated in FIG. 4H or 6H can be used for example to form hybrid technological circuits or heterogeneous functions on a same substrate.

Such architecture can be used for example to form MOS and HBT (HBT for heterojunction bipolar transistor) transistors. It is possible to form MOS transistor channels in the semi-conductor block A for example. In this case, the semi-conductor block A may be for example Si or strained Si based. In the semi-conductor block B, it is possible to form for example bipolar transistor collectors. In this case, the semi-conductor block B may be for example made from a GaAs/AlGaAs/GaAs stack.

Such architecture may also be used for example to form one or more circuits comprising both one or more logic components and one or more opto-electronic components on the same substrate 200. Among the logic component(s) may be for example MOS transistors, that will be formed for example from the semi-conductor block A. Among the opto-electronic components may be a transmitter and/or a modulator and/or a photo detector that will be formed by example from the semi-conductor block B.

In this case, the composition of the semi-conductor block A may be optimized for logic components and may be for example made from Si and/or SiGe and/or Ge that may be compressive strained, whilst the composition of the semi-conductor block B may be optimized for opto-electronic components and may be for example made from Ge that may be compressive strained.

The invention may for example be used for a modulator such as that described by Marris et al. IEEE JOURNAL OF SELECTED TOPICS IN QUANTUM ELECTRONICS, VOL. 9, No 3, P747-754, MAY/JUNE 2003.

A stack of layers forming such a modulator is illustrated in FIG. 9. The invention permits the replacement, on a substrate 500 covered by an insulator 501, of the layer referenced 502, in this example "SiN+", by a doped layer of the type SiGe or strained SiGe, or strained Ge or strained Si or by another semi-conductor crystalline material.

The invention may also for example be used for a transmitter such as that described by Coffa et al. IEEE JOURNAL OF QUANTUM ELECTRONICS, VOL. 36, No 10, P1206-1213, OCTOBER 2000.

Such a transmitter is represented in FIG. 10. The invention permits the replacement of the active layer referenced 550, in this example "N+", by a doped layer of SiGe type or strained SiGe, or strained Ge or strained Si or by another semi-conductor crystalline material.

With regard to forming one or opto-electronic components in one of the semi-conductor blocks, for example in the semi-conductor block B, the material conduction gap or the materials forming this block may be advantageously modulated, for example by means of a strain induced by the initial substrate.

The invention may also permit improved double gate transistor structures to be made.

To do so, a process of the type previously described in relation to the FIGS. 4A to 4D may be carried out.

Then, from the device illustrated in relation to FIG. 4D, the mask 210 can be removed.

The formation of one or more channels, possibly with the help of one or more implantation steps in each of the semi-conductor blocks A and B can be carried out progressively through the process.

Figure 7A:
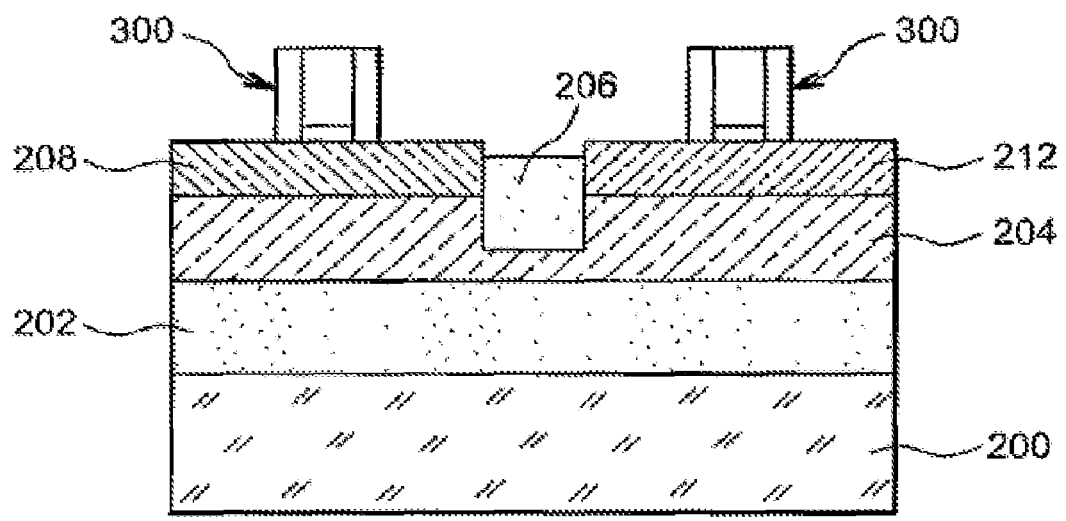

Then at least a first transistor gate 300 is formed on each of the semi-conductor blocks A and B. These first gates 300 may be made first of all by a gate oxide formation step for example by surface oxidation of the semi-conductor blocks A and B or for example by depositing, then by depositing a gate material for example polysilicon on each of said blocks A and B. The creation in the gate material and the gate oxide of at least one gate pattern on each of the blocks, one or more implantation steps, the formation of spacers, one or more other implantation steps, may then be carried out to complete the formation of said first gates 300 (FIG. 7A).

Figure 7B:
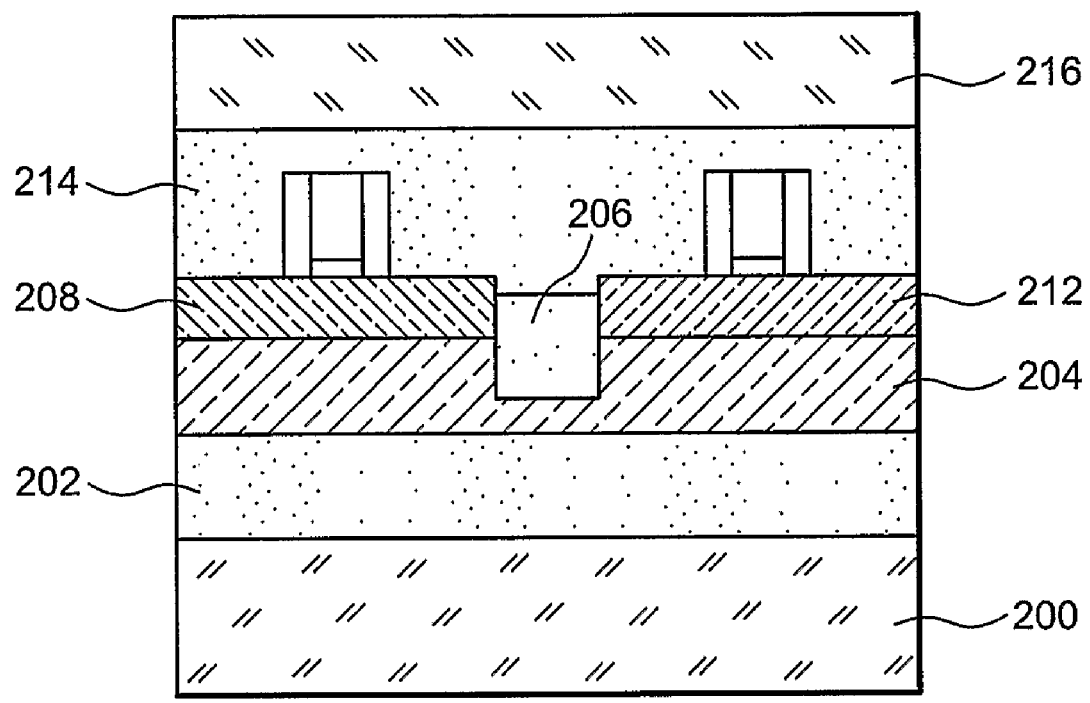

As in the example of the process previously described in relation to FIG. 4E, an insulator 214 is then deposited on it all, so as to cover said first gates 300 entirely. Then, possibly after carrying out a polishing step on the insulating material 214, a second substrate 216 is bonded to the insulating material 214 (FIG. 7B). The second substrate 216 may be of the same type as the first substrate 200 or of a different type. This second substrate 216 may be for example made from Si and/or SiGe and/or GaAs or even of the SOI type.

Figure 7C:
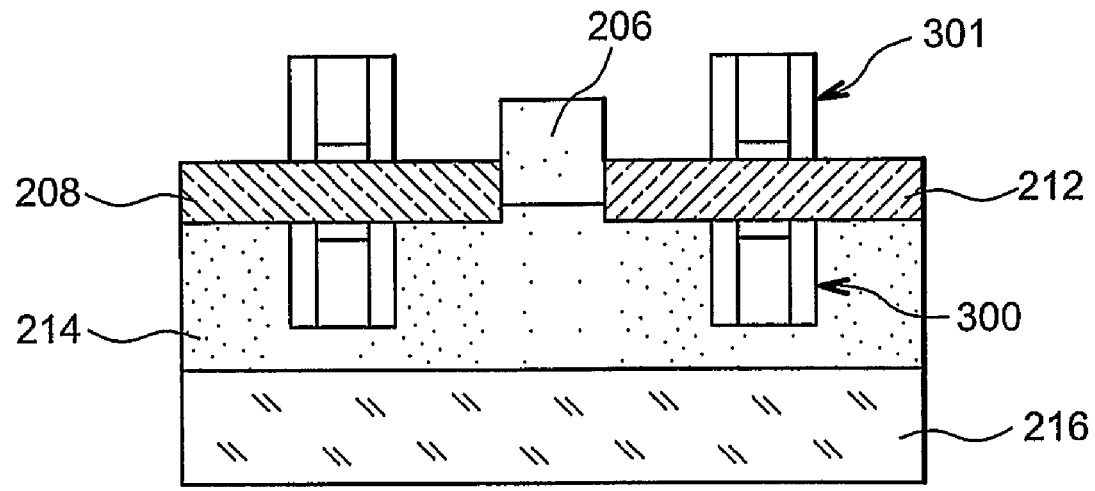

Then as in the example of the process previously described in relation to FIGS. 4E-4F, the first substrate 200 is removed and the first layer 202 and the second layer 204, in order to reveal the semi-conductor blocks A and B. On these semi-conductor blocks A and B, second transistor gates 301 are made, preferably aligned with said first transistor gates 300 in order to form double gate transistors (FIG. 7C).

A variant of the double gate structure creation process previously described, improved in terms of the alignment of the first and second gates may be planned.

According to this variant, based on the device illustrated in relation to FIG. 4D, after removing the mask 210, and possibly carrying out one or more implantation steps to form the transistor channels in particular, a gate oxidation 401 is created, for example by deposition, then the deposition of a gate material 402 for example polysilicon on each of said blocks A and B.

Figure 8A:
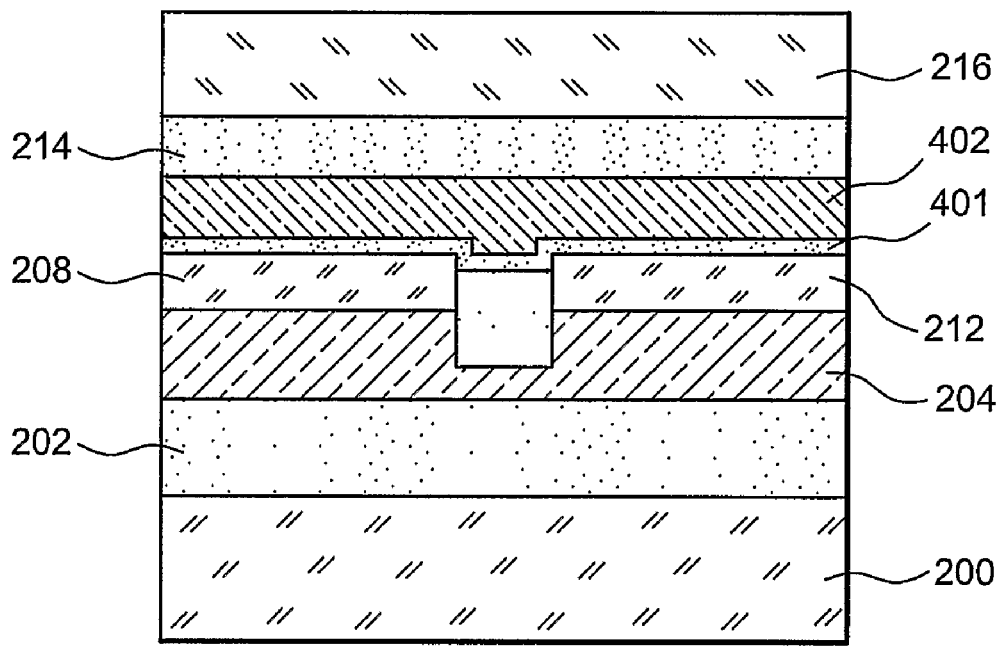

An insulating material 214 is then deposited so that it covers the gate material entirely, then a second substrate 216 is bonded to the insulator 214 without forming gate patterns (FIG. 8A, this figure illustrates the specific case where the gate oxide 401 has been created by deposition).

Then as in the process example previously described in relation to FIGS. 4E-4F, the first substrate 200 is removed and also the first layer 202 and the second layer 204, in order to reveal the semi-conductor blocks A and B.

Figure 8B:
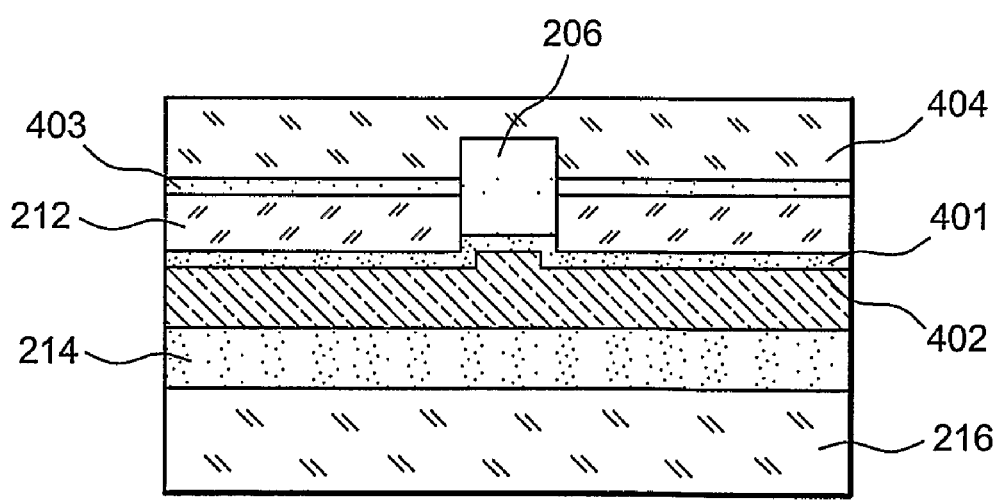

On each of the semi-conductor blocks, A and B, another gate oxide 403 is carried out for example by deposition, then another gate material 404 is deposited (FIG. 8B, this figure illustrates the specific case where the other gate oxide 403 has been created by deposition).

The formation of the first and second gates may then be completed by means of a technique as described in the document FR 2 810 447.

CITED DOCUMENT (1): Ultra-thin strained Si on insulator and SiGe on insulator created using low temperature wafer bonding and metastable layers" Journal of Electrochemical Society, 151 (1), G47-G56 (2004).

The invention claimed is:

1. Process for making a micro-electronic device, comprising the following steps:
   a) forming, on a first substrate and in a vertical direction, at least a first semi-conductor zone made of a first semi-conductor crystalline material, and forming at least a second semi-conductor zone from a second semi-conductor crystalline material different from the first semi-conductor crystalline material,
   b) covering said first and second semi-conductor zones with an insulating layer,
   c) assembling a second substrate on said insulating layer,
   d) eliminating the first substrate, and
   e) forming a lateral space between the first semi-conductor zone and second semi-conductor zone.

2. Process of claim 1, said first semi-conductor zone being formed by at least one epitaxial growth.

3. Process according to claim 1, said second semi-conductor zone being formed by at least one epitaxial growth.

4. Process of claim 3, said second semi-conductor zone being formed by epitaxial growth on one part of said first semi-conductor zone.

5. Process of claim 4, in which a masking step of a portion of said first semi-conductor zone is carried out prior to said epitaxial growth of the second semi-conductor zone, said second semi-conductor zone being formed on another unmasked portion of said first semi-conductor zone.

6. Process of claim 4, said part of said first semi-conductor zone on which the second semi-conductor zone is formed being eliminated after step d).

7. Process of claim 1, the first and second semi-conductor zones being formed by epitaxial growth on a same layer of material.

8. Process of claims 1, in which part of the first semi-conductor zone is etched through a mask prior to the formation of the second semi-conductor zone, said second semi-conductor zone being then formed at the location of said etched part of said first semi-conductor zone.

9. Process of claims 1, comprising among others the formation of a lateral insulation zone in the lateral space between the two semi-conductor zones.

10. Process of claim 1, the lateral insulation zone being obtained by etching a part of the first substrate and/or at least part of the first semi-conductor zone, and by filling the etched part with an insulating material.

11. Process of claim 10, said filling material of said etched part being the material used in step b) to form said insulating thickness b).

12. Process according to claim 1, the first substrate comprising a semi-conductor block, and at least an etch stop layer covering said semi-conductor block.

13. Process according to claim 1, the first semi-conductor zone being made of one or more semi-conductor layers.

14. Process according to claim 13, the second semi-conductor zone being made of one or more semi-conductor layers.

15. Process according to claim 1, the first substrate being made from a second semi-conductor material.

16. Process according to claim 1, the first substrate being made of Si or Ge or GaAs.

17. Process according to claim 1, the insulating thickness formed during step b) comprising $Si_3N_4$ and/or $SiO_2$.

18. Process according to claim 1, comprising among others between steps a) and b), a step for creating the transistor gate on each semi-conductor zone.

19. Process for making a transistor comprising the creation of a micro-electronic device according to claim 1, then the creation of source and drain regions, channel and gate in each-semi-conductor zone.

20. Process according to claim 1, wherein the first and second semi-conductor crystalline materials have different crystalline materials; different crystalline orientations; different crystalline strains; different crystalline materials and orientations; different crystalline materials and strains; different crystalline orientations and strains; or different crystalline materials, orientations, and strain.

21. Process for making a micro-electronic device, comprising the following steps:
   a) forming, on a first substrate, at least a first semi-conductor zone made of a first semi-conductor crystalline material, and forming at least a second semi-conductor zone from a second semi-conductor crystalline material different from the first semi-conductor crystalline material,
   b) covering said first and second semi-conductor zones with an insulating layer, wherein the insulating layer is adjacent to the first and the second semi-conductor zones,
   c) assembling a second substrate on said insulating layer, and
   d) eliminating the first substrate.

22. Process according to claim 21, wherein the first and second semi-conductor crystalline materials have different crystalline materials; different crystalline orientations; different crystalline strains; different crystalline materials and orientations; different crystalline materials and strains; different crystalline orientations and strains; or different crystalline materials, orientations, and strain.

23. Process according to claim 21, wherein the first and second semi-conductor crystalline materials have different crystalline materials; different crystalline orientations; different crystalline strains; different crystalline materials and orientations; different crystalline materials and strains; different crystalline orientations and strains; or different crystalline materials, orientations, and strain.

* * * * *